(12) United States Patent
Cheng et al.

(10) Patent No.: US 9,725,310 B2
(45) Date of Patent: Aug. 8, 2017

(54) MICRO ELECTROMECHANICAL SYSTEM SENSOR AND METHOD OF FORMING THE SAME

(71) Applicant: TAIWAN SEMICONDUCTOR MANUFACTURING COMPANY, LTD., Hsinchu (TW)

(72) Inventors: Chun-wen Cheng, Zhubei (TW);
Hung-Chia Tsai, Taichung (TW);
Lan-Lin Chao, Sindian (TW);
Yuan-Chih Hsieh, Hsinchu (TW);
Ping-Yin Liu, Yonghe (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 476 days.

(21) Appl. No.: 14/135,615

(22) Filed: Dec. 20, 2013

(65) Prior Publication Data
US 2015/0175407 A1 Jun. 25, 2015

(51) Int. Cl.
*B81B 7/00* (2006.01)
*B81C 1/00* (2006.01)

(52) U.S. Cl.
CPC .. *B81C 1/00246* (2013.01); *B81B 2201/0242* (2013.01)

(58) Field of Classification Search
CPC ........ B81C 1/00246; B81C 2203/0735; B81B 2201/0242; B81B 2201/0271; G01P 15/0891; G01P 15/125; H03H 2009/02496; H03H 3/0072; H03H 9/2426; H03H 9/2457

USPC ............... 257/415, 414, 416; 438/50, 51, 53
See application file for complete search history.

(56) References Cited

U.S. PATENT DOCUMENTS

| | | | | |
|---|---|---|---|---|
| 6,854,330 B2* | 2/2005 | Potter | ................... | G01P 15/125 310/309 |
| 7,059,190 B2* | 6/2006 | Sakai | ................... | G01P 15/125 361/280 |
| 7,180,019 B1* | 2/2007 | Chiou | ................... | G01P 15/125 200/61.45 M |
| 7,449,355 B2* | 11/2008 | Lutz | ..................... | B81B 3/0005 438/50 |
| 7,514,760 B1* | 4/2009 | Quevy | ................ | B81C 1/00246 257/414 |
| 7,736,931 B1* | 6/2010 | Guo | ........................ | G01P 15/02 257/E21.613 |
| 8,098,870 B2* | 1/2012 | Kok | ........................ | B81B 3/001 257/419 |
| 8,587,077 B2* | 11/2013 | Chen | ................... | B81C 1/00238 257/254 |
| 8,624,968 B1* | 1/2014 | Hersee | ................... | B82Y 15/00 348/79 |

(Continued)

*Primary Examiner* — Edward Chin
(74) *Attorney, Agent, or Firm* — Hauptman Ham, LLP

(57) ABSTRACT

A micro electromechanical system (MEMS) device includes a MEMS section attached to a substrate, and a cap bonded to a first surface of the substrate. The MEMS device further includes a carrier bonded to a second surface of the substrate opposite the first surface, wherein the carrier is free of active devices, and the cap and the carrier define a vacuum region surrounding the MEMS section. The MEMS device further includes a bond pad on a surface of the carrier opposite the MEMS section, wherein the bond pad is electrically connected to the MEMS section.

20 Claims, 13 Drawing Sheets

(56) References Cited

U.S. PATENT DOCUMENTS

| | | | |
|---|---|---|---|
| 8,692,337 B2* | 4/2014 | Berthelot | B81C 3/008 257/415 |
| 2004/0245586 A1* | 12/2004 | Partridge | B81C 1/00301 257/414 |
| 2005/0161662 A1* | 7/2005 | Majumdar | B82Y 10/00 257/18 |
| 2006/0163679 A1* | 7/2006 | LaFond | G01C 19/5719 257/414 |
| 2007/0158767 A1* | 7/2007 | Sinclair | B81B 3/004 257/415 |
| 2008/0119000 A1* | 5/2008 | Yeh | B81C 1/00246 438/50 |
| 2009/0050204 A1* | 2/2009 | Habib | H01L 31/03529 136/261 |
| 2010/0005884 A1* | 1/2010 | Weinberg | G01C 19/5719 73/504.15 |
| 2010/0006972 A1* | 1/2010 | La Tulipe, Jr. | H01L 21/02002 257/499 |
| 2010/0148221 A1* | 6/2010 | Yu | B82Y 20/00 257/225 |
| 2010/0148341 A1* | 6/2010 | Fuji | B81B 7/007 257/686 |
| 2010/0149625 A1* | 6/2010 | Lu | B81C 1/00238 359/291 |
| 2010/0176466 A1* | 7/2010 | Fujii | B81B 7/007 257/415 |
| 2010/0240215 A1* | 9/2010 | Huang | B81C 1/0015 438/669 |
| 2011/0037160 A1* | 2/2011 | Hsu | B81C 1/00246 257/690 |
| 2011/0133061 A1* | 6/2011 | Yu | B82Y 15/00 250/214.1 |
| 2011/0133160 A1* | 6/2011 | Yu | H01L 27/14607 257/14 |
| 2011/0272796 A1* | 11/2011 | Eaton | B81C 1/00269 257/682 |
| 2012/0119311 A1* | 5/2012 | Akhlaghi Esfahany | G01P 15/0802 257/415 |

* cited by examiner

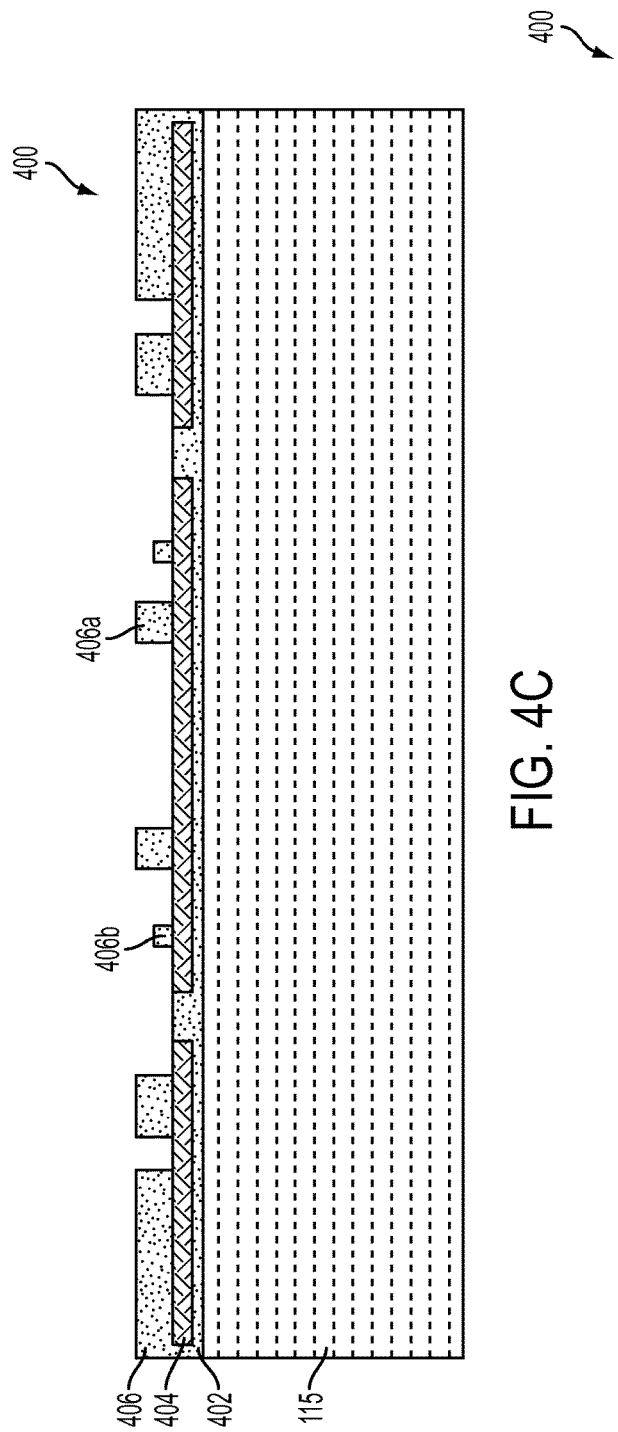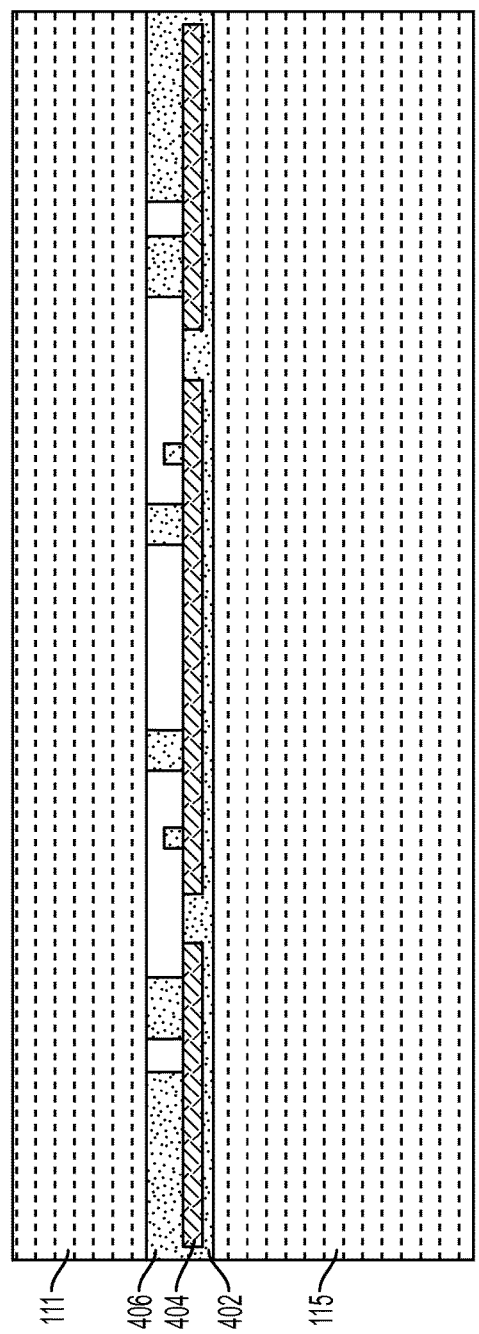

MICRO ELECTROMECHANICAL SYSTEM SENSOR AND METHOD OF FORMING THE SAME

BACKGROUND

Micro electromechanical systems (MEMS) sensors are used for various applications including gyroscopes, accelerometers or other sensing applications. A vacuum region is maintained around the MEMS sensor. Signals generated using the MEMS sensors are transmitted to a complementary metal oxide semiconductor (CMOS) package through an interconnect structure.

The CMOS package is electrically connected to the MEMS sensors using a eutectic bond interface between a bond pad on the CMOS package and a bond pad on the MEMS sensor. The interconnect structure is in contact with the vacuum region around the MEMS sensors.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion. The figures of the present embodiments, incorporated herein by reference, include the following:

FIGS. 4A-4K are cross sectional views of a MEMS package during various stages of production in accordance with one or more embodiments.

DETAILED DESCRIPTION

The following disclosure provides many different embodiments, or examples, for implementing different features of the invention. Specific examples of components and arrangements are described below to simplify the present disclosure. These are examples and are not intended to be limiting.

Figure 1:
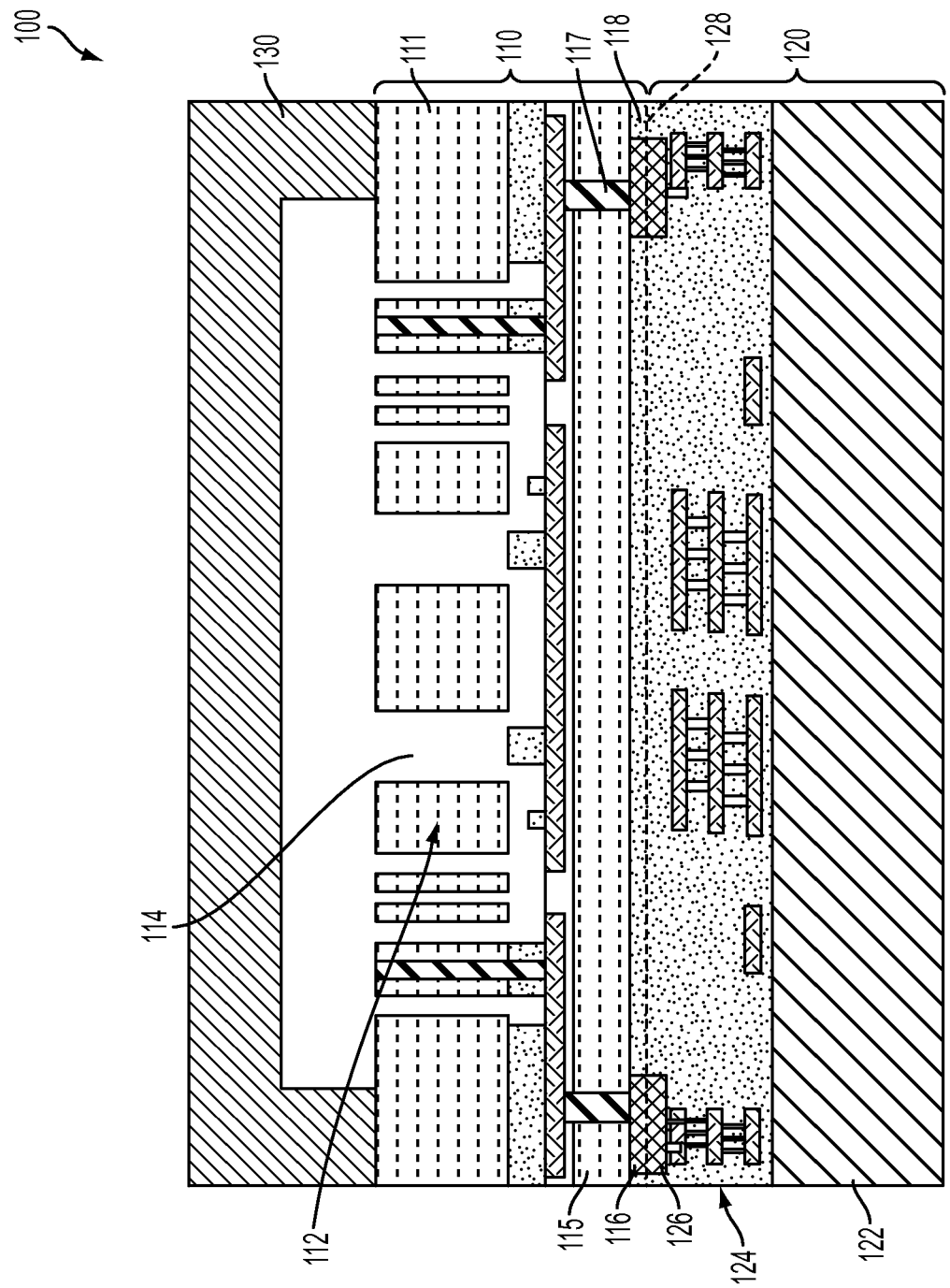
FIG. 1 is a cross sectional view of a micro electromechanical system (MEMS) device in accordance with one or more embodiments.

FIG. 1 is a cross sectional view of a micro electromechanical system (MEMS) device 100, in accordance with one or more embodiments. MEMS device 100 includes a MEMS wafer 110. MEMS wafer 110 includes a substrate 111 and a MEMS section 112 formed in the substrate. A vacuum region 114 is around MEMS section 112. A vacuum is maintained in the vacuum region 114 in order to help facilitate movement of the MEMS section relative to substrate 111. MEMS wafer 110 further includes a carrier 115 and a bond pad 116 on a surface of the carrier opposite MEMS section 112. A conductive plug 117 passes through carrier 115 to provide electrical connection between MEMS section 112 and bond pad 116. An oxide layer 118 is over the surface of carrier 115 and bond pad 116 is in the oxide layer. MEMS device 100 further includes an active circuit wafer 120 bonded to MEMS wafer 110. Active circuit wafer 120 includes an active circuit substrate 122 which includes active devices. An interconnect structure 124 is over active circuit substrate 122 to provide electrical connections between the active devices and MEMS section 112. Interconnect structure 124 includes a dielectric material surrounding conductive lines and vias which are configured to transfer signals to and from active circuit substrate 122. A bond pad 126 is on a top surface of interconnect structure 124 to electrically connect to bond pad 116 of MEMS wafer 110. An interface 128 between MEMS wafer 110 and active circuit wafer 120 defines a bonding location of the MEMS wafer to the active circuit wafer. MEMS device 100 further includes a cap wafer 130 bonded to MEMS wafer 110 on an opposite side from active circuit wafer 120. Cap wafer 130 helps define a location of vacuum region 114 around MEMS section 112.

Substrate 111 provides mechanical support for MEMS section 112. In some embodiments, MEMS section 112 is formed by removing portions of substrate 111, e.g., by etching. In some embodiments, MEMS section 112 is connected to substrate 111 by torsion elements, tethers or other suitable connection elements. In some embodiments, substrate 111 includes sensing elements configured to generate and transfer signals based on a position of MEMS section 112.

In some embodiments, substrate 111 includes an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor substrate has a gradient SiGe feature in which the Si and Ge composition change from one ratio at one location to another ratio at another location of the gradient SiGe feature. In some embodiments, the alloy SiGe is formed over a silicon substrate. In some embodiments, substrate 111 is a strained SiGe substrate. In some embodiments, the semiconductor substrate has a semiconductor on insulator structure, such as a silicon on insulator (SOI) structure. In some embodiments, the semiconductor substrate includes a doped epi layer or a buried layer. In some embodiments, the compound semiconductor substrate has a multilayer structure, or the substrate includes a multilayer compound semiconductor structure.

MEMS section 112 includes a MEMS element which is configured to rotate or translate within vacuum region 114. Movement of MEMS section 112 within vacuum region 114 creates varying electrical signals which are transferred to the active devices in active circuit wafer 120. In some embodiments, MEMS section 112 includes a gyroscope, an accelerometer, a pressure sensor, or another suitable MEMS element. In some embodiments, MEMS section 112 includes magnetic elements which are configured to induce electrical signals due to the movement of the MEMS section. In some embodiments, MEMS section 112 is configured to rotate about one or more axis. In some embodiments, MEMS section 112 is configured to translate in a plane parallel to a top surface of substrate 111.

Vacuum region 114 surrounds MEMS section 112. The vacuum in vacuum region 114 is used to facilitate free movement of MEMS section 112 with minimal resistance. In some embodiments, a pressure in vacuum region 114 is less than or equal to 0.001 millibar (mbar). If the pressure is too high, MEMS section 112 will experience higher resistance to movement, in some embodiments. Resistance to movement of MEMS section 112 reduces a speed of movement of the MEMS section which delays generation and transfer of signals induced by the movement of the MEMS section. The higher resistance to movement will also decrease precision of the signals generated by the movement of MEMS section 112. The decreased precision in turn increases a complexity of calculations used to determine the information being generated by MEMS section 112. As the complexity of a circuit increases, a number of devices in the circuit and a size of the circuit also increase.

Carrier 115 provides additional mechanical support for MEMS section 112. In addition, carrier 115 separates interconnect structure 124 from vacuum region 114. Separating interconnect structure 124 from vacuum region 114 helps to prevent outgassing from interconnect structure 124 into vacuum region 114 which increases the pressure in the vacuum region. In some embodiments, carrier 115 includes a same material as substrate 111. In some embodiments, carrier 115 includes a different material from substrate 111.

Outgassing is a result of dangling bonds formed during formation of the conductive lines and vias in interconnect structure 124. During subsequent processing steps, heating causes the dangling bonds to break which releases gas from interconnect structure 124. This process is known as outgassing. Pressure is directly proportional to a number of gas molecules in a space. In approaches which do not include carrier 115 between interconnect structure 124 and vacuum region 114, as the number of gas molecules in vacuum region 114 rises, the pressure also rises, increasing the resistance to movement of MEMS section 112.

Bond pad 116 is on a surface of carrier 115 opposite MEMS section 112. Bond pad 116 is used to provide electrical connection between MEMS wafer 110 and active circuit wafer 120 or other external circuitry. In some embodiments, bond pad 116 includes copper, copper alloys, or other suitable conductive elements.

Conductive plug 117 passes through carrier 115 and electrically connects to bond pad 116. Conductive plug 117 is configured to convey electrical signals from MEMS section 112 to bond pad 116. In some embodiments, conductive plug 117 includes tungsten, copper, conductive polymer, or another suitable conductive element.

Oxide layer 118 is over the surface of carrier 115 opposite MEMS section 112. Oxide layer 118 is configured to electrically insulate bond pad 116. Oxide layer 118 also provides an increased area for fusion bonding with interconnect structure 124. In approaches which include interconnect structure 124 adjacent to vacuum region 114, bonding between the interconnect structure and MEMS wafer 110 is achieved solely by a eutectic bond between bond pad 116 and bond pad 126. A mechanical strength of eutectic bonding between bond pad 116 and bond pad 126 is lower than a mechanical strength of fusion bonding which is achievable by bonding oxide layer 118 to interconnect structure 124 along with fusion bonding of bond pad 116 to bond pad 126. Oxide layer 118 helps to increase the mechanical strength of the bond between MEMS wafer 110 and active circuit wafer 120 in comparison with other approaches which do not include the oxide layer. The increased mechanical strength increases longevity of MEMS device 100 in comparison with other approaches.

Active circuit substrate 122 includes active circuitry configured to perform calculations or execute procedures based on signals received from MEMS section 112 through bond pad 116. In some embodiments, active circuit substrate 112 includes complementary metal oxide semiconductor (CMOS) devices, bi-polar transistor (BJT) devices, Fin field effect transistor (FinFET) devices, or other suitable active devices.

Interconnect structure 124 is configured to convey signals to and from active circuit substrate 122. Interconnect structure 124 includes conductive lines and vias in a dielectric material. In some embodiments, the conductive lines and vias include copper, aluminum, conductive polymers, or other suitable conductive elements. In some embodiments, the dielectric material includes low k dielectric materials, ultra-low k dielectric materials, or another suitable material. Low k materials have a dielectric constant less than a dielectric constant of silicon oxide. In some embodiments, low k materials have a dielectric constant less than about 3.9. In some embodiments, low k materials include fluorine-doped silicon oxide, carbon-doped silicon oxide, porous silicon oxide, polymer materials, or other suitable low k materials. In some embodiments, ultra-low k materials have a dielectric constant less than or equal to about 2.5. In some embodiments, ultra-low k materials include xerogel, polymers, or other suitable ultra-low k materials.

In some embodiments, interconnect structure is formed by a damascene process in which the dielectric material is etched to form openings. A conductive material is formed within the openings to provide the conductive lines or vias. The processing of the dielectric materials creates dangling bonds. These dangling bonds are trapped within interconnect structure 124. Heat associated with subsequent processing results in these dangling bonds breaking free of interconnect structure 124 and outgassing from the interconnect structure. In approaches which position interconnect structure 124 adjacent to vacuum region 114, this outgassing increases the pressure in vacuum region thereby increasing resistance to movement of MEMS section 114. MEMS device 100 includes carrier 115 between interconnect structure 124 and vacuum region 114 to help prevent outgassing from the interconnect structure raising the pressure in the vacuum region. The arrangement in MEMS device 100 helps to maintain a low pressure in vacuum region 114 to help minimize resistance to movement of MEMS section 112.

Bond pad 126 is on a surface of interconnect structure 124 opposite active circuit substrate 122. Bond pad 126 is used to provide electrical connection between MEMS wafer 110 and active circuit wafer 120. In some embodiments, bond pad 126 includes copper, copper alloys, or other suitable conductive elements. In some embodiments, bond pad 126 is a top conductive line of interconnect structure 124. In some embodiments, bond pad 126 is formed on top of interconnect structure 124. In some embodiments, bond pad 126 includes a same material as bond pad 116. In some embodiments, bond pad 126 includes a different material from bon pad 116.

Interface 128 is a location of the bonding between MEMS wafer 110 and active circuit wafer 120. Interface 128 extends across an entirety of interconnect structure 124 and oxide layer 118 to help increase the mechanical strength of the bonding. In some embodiments, bond pad 116 and bond pad 126 undergo re-graining during the bonding process. Re-graining occurs when grain boundaries of bond pad 116 and bond pad 126 break down due to thermal processing associated with the bonding process. New grains which extend across interface 128 are formed during cooling of bond pad 116 and bond pad 126. The re-graining process helps to increase the mechanical strength of the bond between bond pad 116 and bond pad 126. Re-graining also helps to reduce electrical resistance between the two bond pads. The reduced electrical resistance increases a speed of signal transfer from MEMS wafer 110 to active circuit wafer 120.

Cap 130 is used to define a boundary for vacuum region 114. Cap 130 helps to prevent an increase in pressure in vacuum region 114 from an external environment. Cap 130 is fusion bonded to substrate 111 to provide a seal around MEMS section 112. In some embodiments, a metal layer is formed on a bottom surface of cap 130 and a top surface of substrate 111 and the cap is eutectically bonded to substrate 111. In some embodiments, cap 130 includes a same material as at least one of substrate 111 or active circuit substrate 122. In some embodiments, cap 130 includes a different material from both substrate 111 and active circuit substrate 122.

Figure 2A:
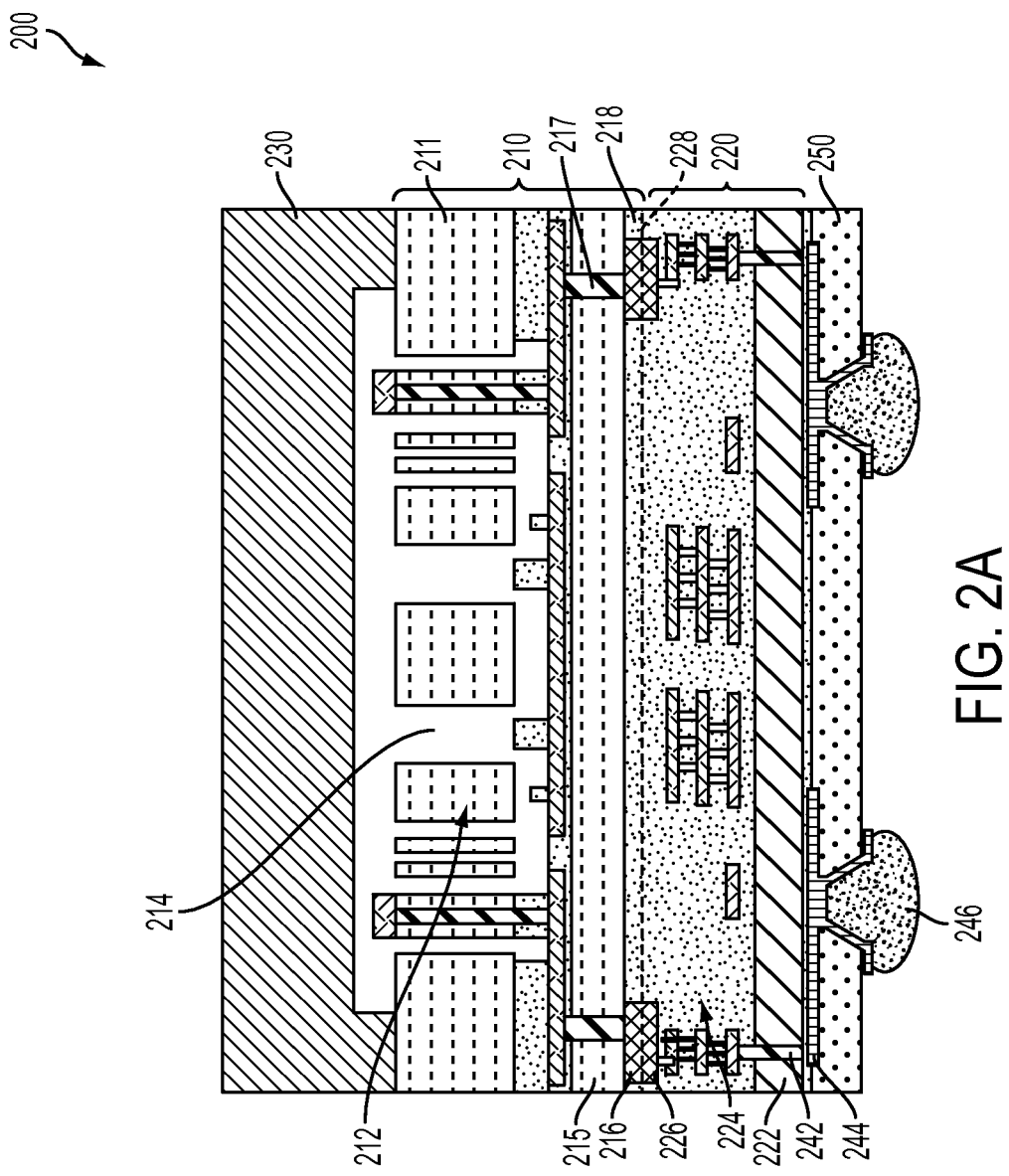
FIG. 2A is a cross sectional view of a MEMS package in accordance with one or more embodiments.

FIG. 2A is a cross sectional view of a MEMS package 200 in accordance with one or more embodiments. MEMS package 200 is similar to MEMS device 100. Similar elements have a same reference number increased by 100. In contrast with MEMS device 100, MEMS package 200 includes a via plug 242 passing through active circuit substrate 222. MEMS package 200 also includes a re-distribution layer (RDL) 244 electrically connected to via plug 242, and a solder ball 246 electrically connected to the RDL. A polymer layer 250 is over a surface of active circuit substrate 222 opposite interconnect structure 224.

Via plug 242 is used to convey electrical signals from active circuit wafer 220 or MEMS wafer 210 to external circuitry. In some embodiments, via plug 242 includes tungsten, or another suitable conductive element.

RDL 244 is configured to electrically connect via plug 242 with solder ball 246. RDL 244 enables offsetting solder ball 246 from via plug 242 in order to accommodate connections with external circuitry which do not have contacts which align with via plug 242. In some embodiments, RDL 244 includes copper, aluminum, tungsten, or other suitable conductive materials.

Solder ball 246 is used to provide electrical connection with external circuitry. In some embodiments, solder ball 246 includes lead-free solder. In some embodiments, solder ball 246 includes tin silver (SnAg) solder, or another suitable solder composition.

Polymer layer 250 provides cushioning for MEMS package 200 during a packaging process with the external circuitry to reduce a risk of damage to the MEMS package. Polymer layer 250 also helps to provide mechanical strength to solder ball 246. In some embodiments, polymer layer 250 includes polybenzoxazole (PBO), polyimide, or another suitable polymer material.

Figure 2B:
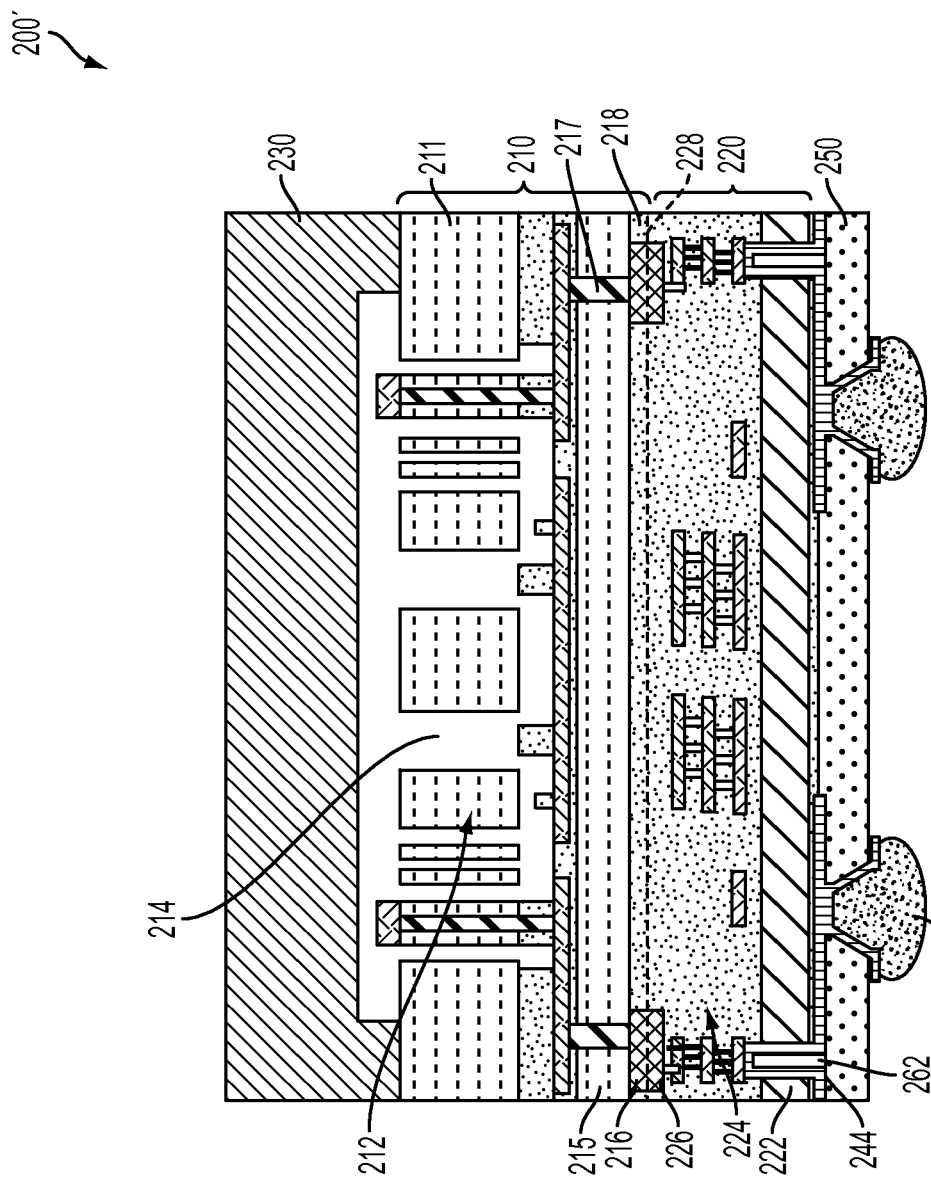
FIG. 2B is a cross sectional view of a MEMS package in accordance with one or more embodiments.

FIG. 2B is a cross sectional view of a MEMS package 200' in accordance with one or more embodiments. MEMS package 200' is similar to MEMS package 200. Similar elements have a same reference number. In contrast with MEMS package 200, MEMS package 200' includes a through substrate via (TSV) 262 instead of via plug 242.

TSV 262 is used to convey electrical signals from active circuit wafer 220 or MEMS wafer 210 to external circuitry. In comparison with via plug 242, TSV 262 has a greater width. A wider range of materials are also available to form TSV 262 in comparison with via plug 242. In some embodiments, TSV 262 includes a conductive material such as copper, aluminum, tungsten, or another suitable conductive material. In some embodiments, TSV 262 includes a diffusion barrier material between active circuit substrate 222 and the conductive material of the TSV.

Figure 3:
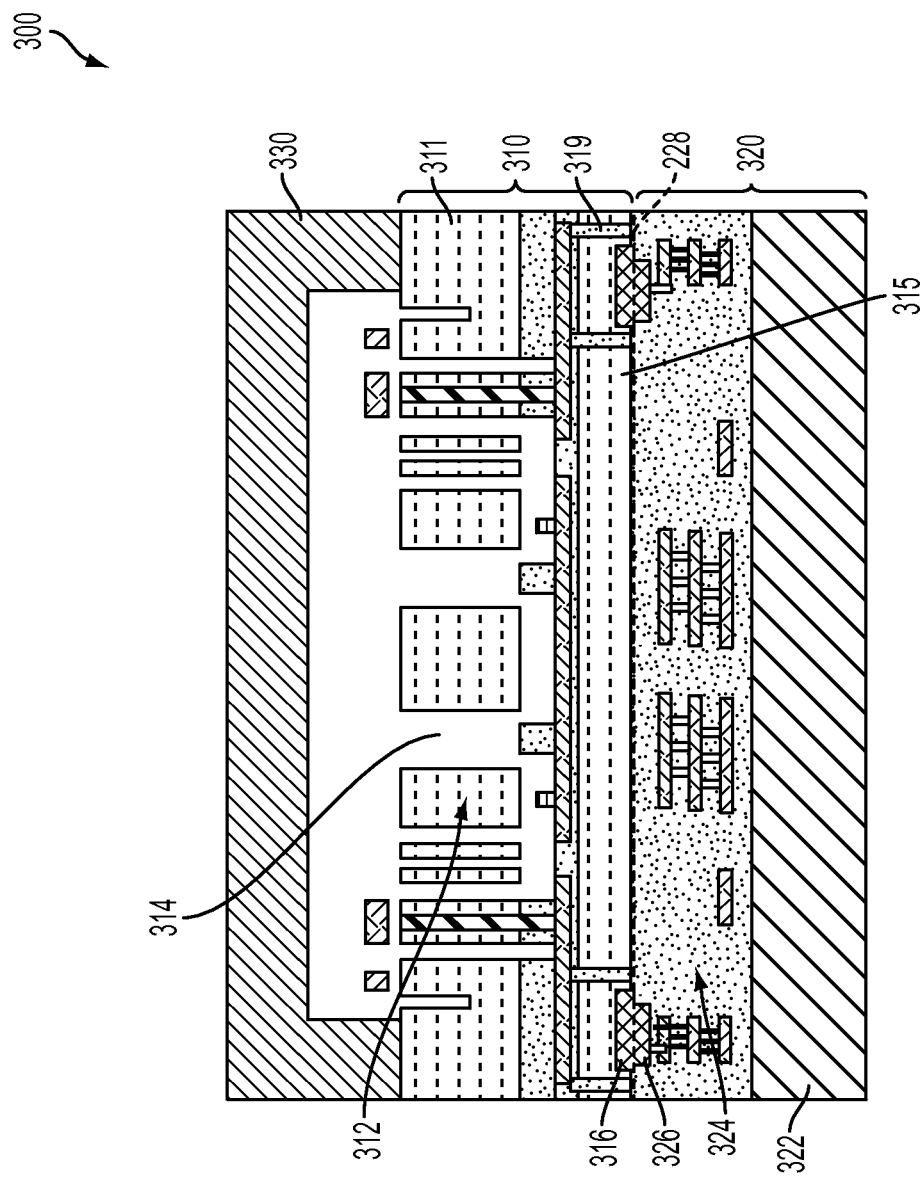
FIG. 3 is a cross sectional view of a MEMS device in accordance with one or more embodiments.

FIG. 3 is a cross sectional view of a MEMS device 300 in accordance with one or more embodiments. MEMS device 300 is similar to MEMS device 100. Similar elements have a same reference number increased by 200. In contrast with MEMS device 100, MEMS device 300 includes isolation trench 319 surrounding bond pad 316. MEMS device 300 also lacks conductive plug 117. Carrier 315 in MEMS device 300 is a semiconductor material capable of conveying an electrical signal directly to bond pad 316. In some embodiments, bond pad 316 is within carrier 315 and MEMS device 300 is free of oxide layer 118. In some embodiments where bond pad 316 is within carrier 315, MEMS wafer 310 is bonded to active circuit wafer 320 by semiconductor-oxide fusion bonding, such as silicon-oxide fusion bonding. In some embodiments, bond pad 316 is within carrier 315 and a thin oxide layer is over a surface of the carrier except where the bond pad is located to facilitate oxide-oxide fusion bonding.

Isolation trench 319 is configured to electrically isolate bond pad 316 from portions of carrier 315 outside the isolation trench. Isolation trench 319 extends completely through carrier 315. In some embodiments, isolation trench 319 includes a shallow trench isolation (STI), local oxidation of silicon (LOCOS), or another suitable isolation feature.

One of ordinary skill in the art would recognize that MEMS device 300 is able to be modified to include packaging elements similar to those of MEMS package 200 and MEMS package 200' in order to electrically connect MEMS device 300 to external circuitry.

Figure 4A:
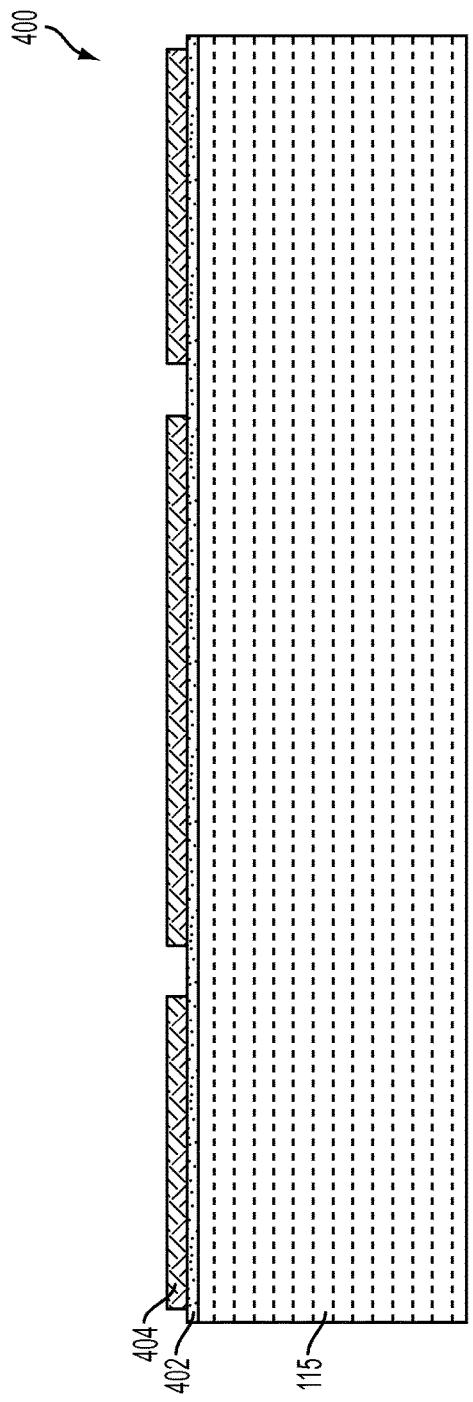

FIG. 4A is cross sectional views of a MEMS package 400 during a stage of production in accordance with one or more embodiments. MEMS package 400 is similar to MEMS device 100. Similar elements have a same reference number. Greater details regarding a structure of MEMS package 400 are provided with respect to MEMS device 100. Elements discussed with respect to MEMS package 400 are also included in MEMS device 100, in some embodiments.

In FIG. 4A, a first oxide layer 402 is formed over carrier 115. A first conductive layer 404 is formed over first oxide layer 402. First conductive layer 404 is patterned to expose portions of first oxide layer 402.

First oxide layer 402 provides electrical isolation between carrier 115 and first conductive layer 404. In some embodiments, first oxide layer 402 includes silicon oxide, or another suitable oxide material. In some embodiments, first oxide layer 402 has a thickness ranging from about 0.5 microns (μm) to about 5 μm. The thickness of first oxide layer 402 is selected depending on an amount of isolation desired between carrier 115 and first conductive layer 404. In some embodiments, first oxide layer 402 is formed by physical vapor deposition (PVD), chemical vapor deposition (CVD), sputtering or other suitable formation methods.

First conductive layer 404 provides electrical connection to MEMS section 112, which is formed during subsequent processing. In some embodiments, first conductive layer 404 includes copper, aluminum, or other suitable conductive materials. In some embodiments, first conductive layer 404 is formed by PVD, atomic layer deposition (ALD), plating, sputtering, or other suitable formation methods. In some embodiments, first conductive layer 404 is patterned using a photolithography/etching process, such as wet etching or dry etching, laser drilling, or another suitable patterning process.

Figure 4B:
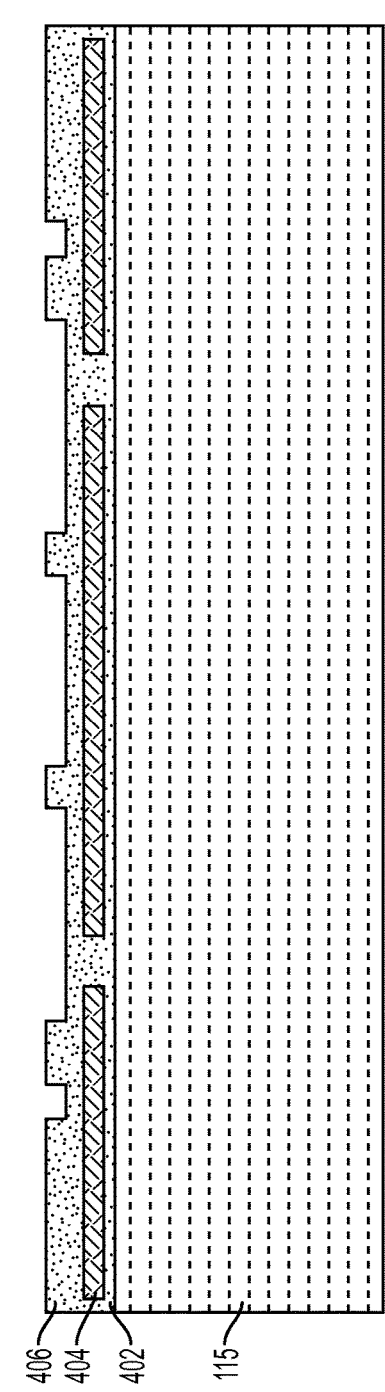

FIG. 4B is cross sectional views of MEMS package 400 during a stage of production in accordance with one or more embodiments. A second oxide layer 406 is formed over first conductive layer 404. Second oxide layer 406 is patterned a first time. In some embodiments, second oxide layer 406 has a thickness ranging from about 1 μm to about 3 μm. If the thickness of second oxide layer 406 is less than about 1 μm, durability of MEMS package 400 is reduced, in some embodiments. If the thickness of second oxide layer 406 is greater than about 3 μm, a sensitivity of MEMS package 400 is reduced, in some embodiments. In some embodiments, second oxide layer 406 includes a same material as first oxide layer 402. In some embodiments, second oxide layer 406 includes a different material from first oxide layer 402. In some embodiments, second oxide layer 406 is formed using CVD, PVD, sputtering, or other suitable formation processes. In some embodiments, second oxide layer 406 is formed using a same process as that used to form first oxide layer 402. In some embodiments, second oxide layer 406 is formed using a different process from that used to form first oxide layer 402. In some embodiments, second oxide layer 406 is patterned using a photolithography/etching process, such as wet etching or dry etching, laser drilling, or other suitable material removal processes.

FIG. 4C is cross sectional views of MEMS package 400 during a stage of production in accordance with one or more embodiments. Second oxide layer 406 is patterned a second time to form a first step 406a and a second step 406b. First step 406a is used to bond to substrate 111 during subsequent processing. Second step 406b is used as a stop for MEMS section 112 during operation. In some embodiments, first step 406a and second step 406b are formed using a photolithography/etching process, such as wet etching or dry etching, laser drilling, or other suitable material removal processes. In some embodiments, first step 406a and second step 406b are formed using a same process as the first patterning of second oxide layer 406. In some embodiments, first step 406a and second step 406b are formed using a different process from the first patterning of second oxide layer 406.

FIG. 4D is cross sectional views of MEMS package 400 during a stage of production in accordance with one or more embodiments. Substrate 111 is bonded to second oxide layer 406. Substrate is bonded to first steps 406a. In some embodiments, substrate 111 is fusion bonded to first steps 406a. In some embodiments, the bonding process is performed at a temperature ranging from about 250° C. to about 700° C. In some embodiments, the bonding process has a duration ranging from about 5 minutes to about 30 minutes. In some embodiments, substrate 111 is pressed against first steps 406a at a pressure ranging from about 10 kiloNewtons (kN) to about 90 kN. In some embodiments, the bonding process is performed in an environment including argon, nitrogen gas, hydrogen gas, or other suitable gases.

In some embodiments, substrate 111 is thinned following being bonded to second oxide layer 406. In some embodiments, substrate 111 is thinned by a grinding process, a chemical mechanical polishing (CMP) process, an etching process or another suitable material removal process.

Figure 4E:
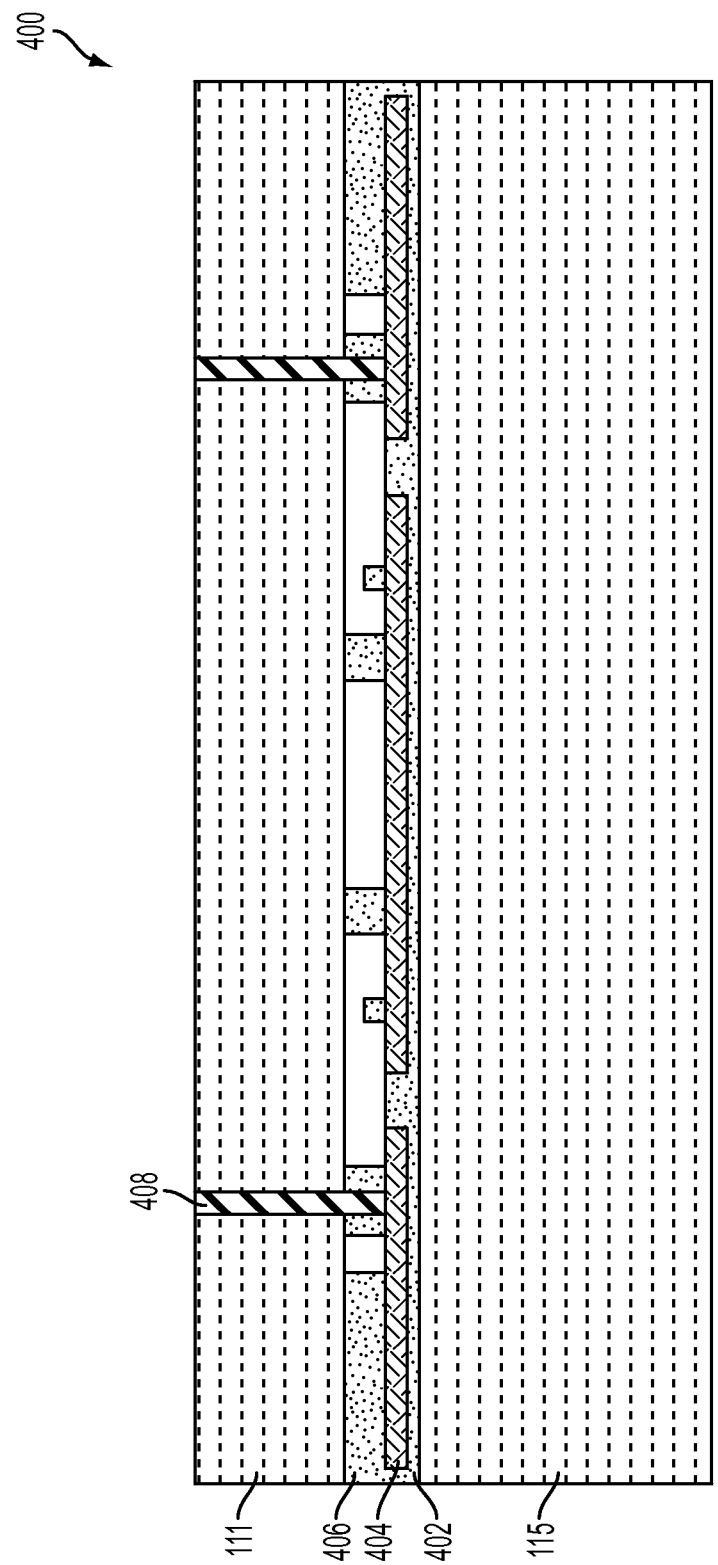

FIG. 4E is cross sectional views of MEMS package 400 during a stage of production in accordance with one or more embodiments. A conductive via 408 is formed in substrate 111 to electrically connect to first conductive layer 404. Conductive via 408 extends through substrate 111 and second oxide layer 406 to connect to first conductive layer 404. Conductive via 408 is formed by making an opening in substrate 111 and second oxide layer 408; and depositing a conductive material in the opening. In some embodiments, the opening is formed by a photolithography/etching process, a laser drilling process, or another suitable material removal process. In some embodiments, the conductive material includes tungsten, copper or another suitable conductive material. In some embodiments the conductive material is formed by PVD, ALD, sputtering or another suitable formation method. In some embodiments, a barrier layer is formed between the conductive material and sidewalls of the opening.

Figure 4F:
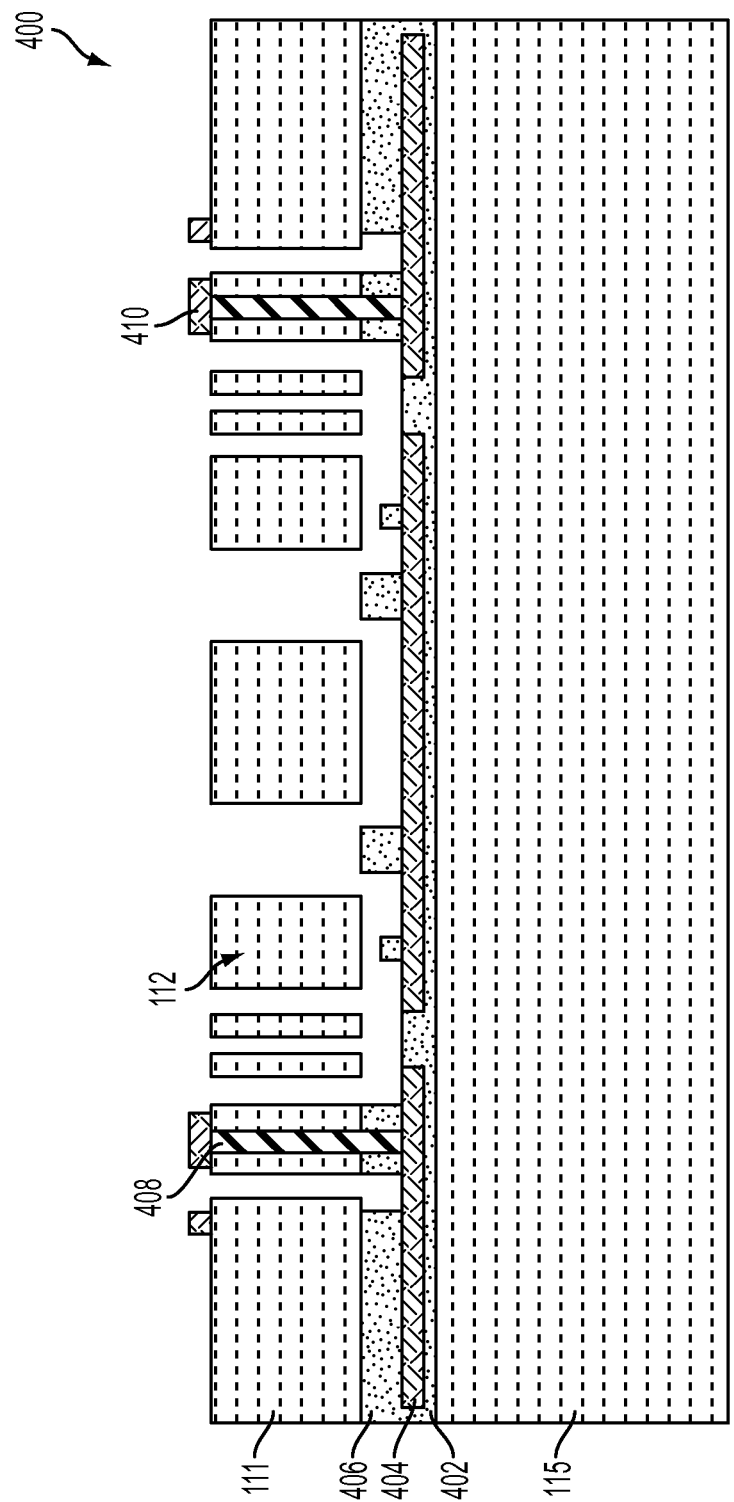

FIG. 4F is cross sectional views of MEMS package 400 during a stage of production in accordance with one or more embodiments. A second conductive layer 410 is formed over substrate 111 and patterned. Second conductive layer 410 electrically connects to conductive via 408. In some embodiments, second conductive layer 410 is patterned to provide a location for later eutectic bonding with cap 130. In some embodiments, second conductive layer 410 includes copper, aluminum or another suitable conductive material. In some embodiments, second conductive layer 410 includes a same material as first conductive layer 404. In some embodiments, second conductive layer 410 includes a different material from first conductive layer 404. In some embodiments, second conductive layer 410 is patterned using a photolithography/etching process, such as wet etching or dry etching, laser drilling, or another suitable patterning process. In some embodiments, the patterning process for second conductive layer 410 is a same patterning process as for first conductive layer 404. In some embodiments, the patterning process for second conductive layer 410 is different from the patterning process for first conductive layer 404.

Following patterning of second conductive layer 410, substrate 111 is patterned to produce MEMS section 112. In some embodiments, MEMS section is produced using a dry reactive ion etch, laser drilling or another suitable patterning process. In some embodiments, portions of substrate 111 remain to connect MEMS section 112 to supporting sections of substrate 111.

Figure 4G:
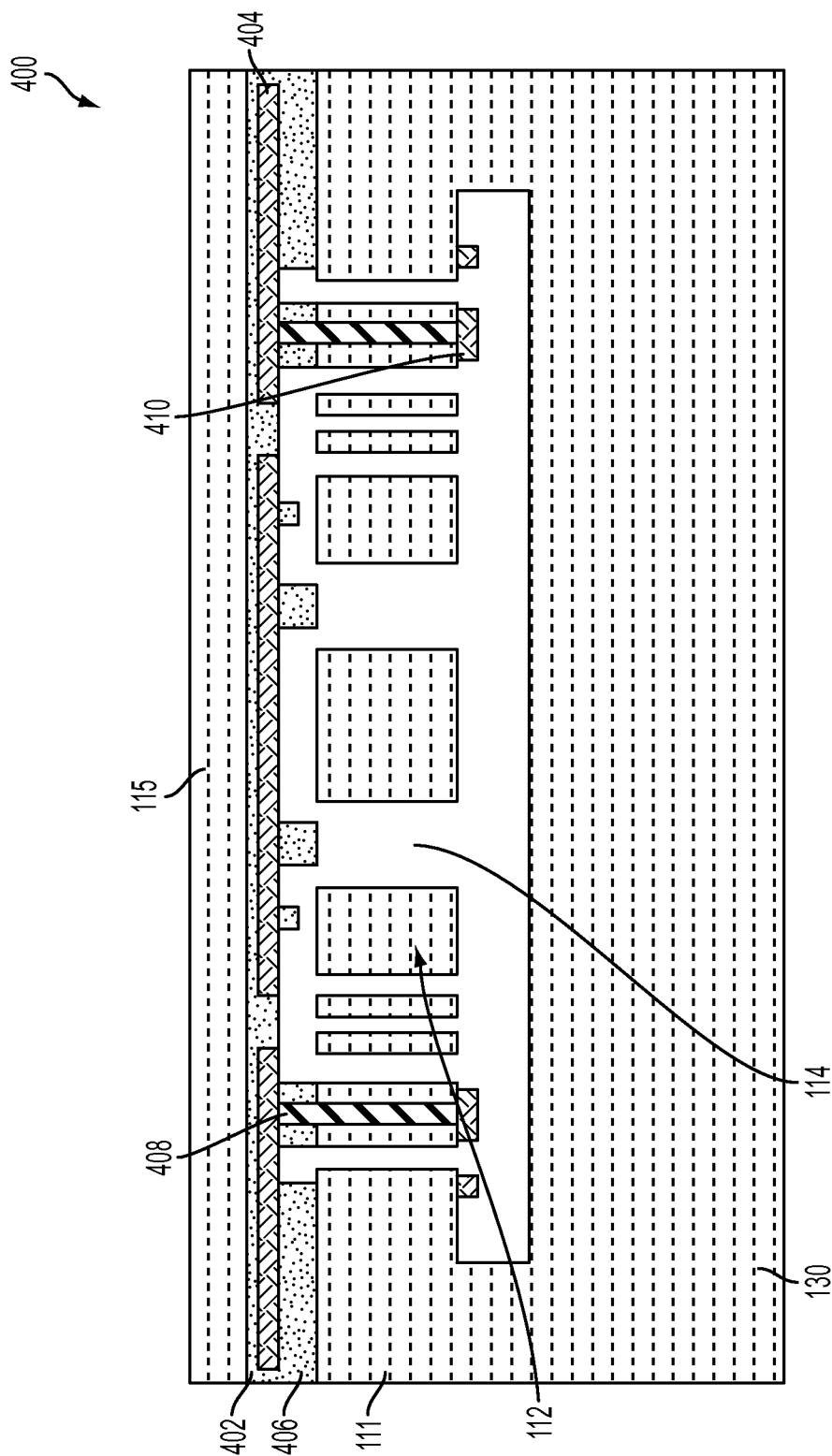

FIG. 4G is cross sectional views of MEMS package 400 during a stage of production in accordance with one or more embodiments. Cap 130 is bonded to substrate 111. Cap 130 is used to seal vacuum region 114 around MEMS section 112. In some embodiments, cap 130 is patterned prior to bonding with substrate 111 to provide sufficient space for MEMS section 112 to move. In some embodiments, cap 130 is formed by a molding process to provide sufficient space for MEMS section 112 to move. In some embodiments, cap 130 is fusion bonded to substrate 111. In some embodiments, cap 130 is fusion bonded to substrate 111 using a same process as bonding substrate 111 to second oxide layer 406. In some embodiments, cap 130 is fusion bonded to substrate 111 using a different process from the bonding of substrate 111 to second oxide layer 406.

In some embodiments, cap 130 is eutectically bonded to substrate 111. In embodiments where cap 130 is eutectically bonded to substrate 111, the cap include metal layers aligned with portions of second conductive layer 410 to provide a location for eutectic bonding. In some embodiments, substrate 111 is fusion bonded to first steps 406a. In some embodiments, the eutectic bonding process is performed at a temperature ranging from about 430° C. to about 460° C. In some embodiments, cap 130 is pressed against substrate 111 at a pressure ranging from about 30 kN to about 60 kN. In some embodiments, the eutectic bonding process is performed in an environment including argon, nitrogen gas, hydrogen gas, or other suitable gases.

Carrier 115 is thinned following bonding of cap 130 to substrate 111. In some embodiments, carrier 115 is thinned by a grinding process, a CMP process, an etching process, or another suitable etching process. In some embodiments, carrier 115 is thinned using a same process as that used to thin substrate 111. In some embodiments, carrier 115 is thinned using a different process from that used to thin substrate 111.

Figure 4H:
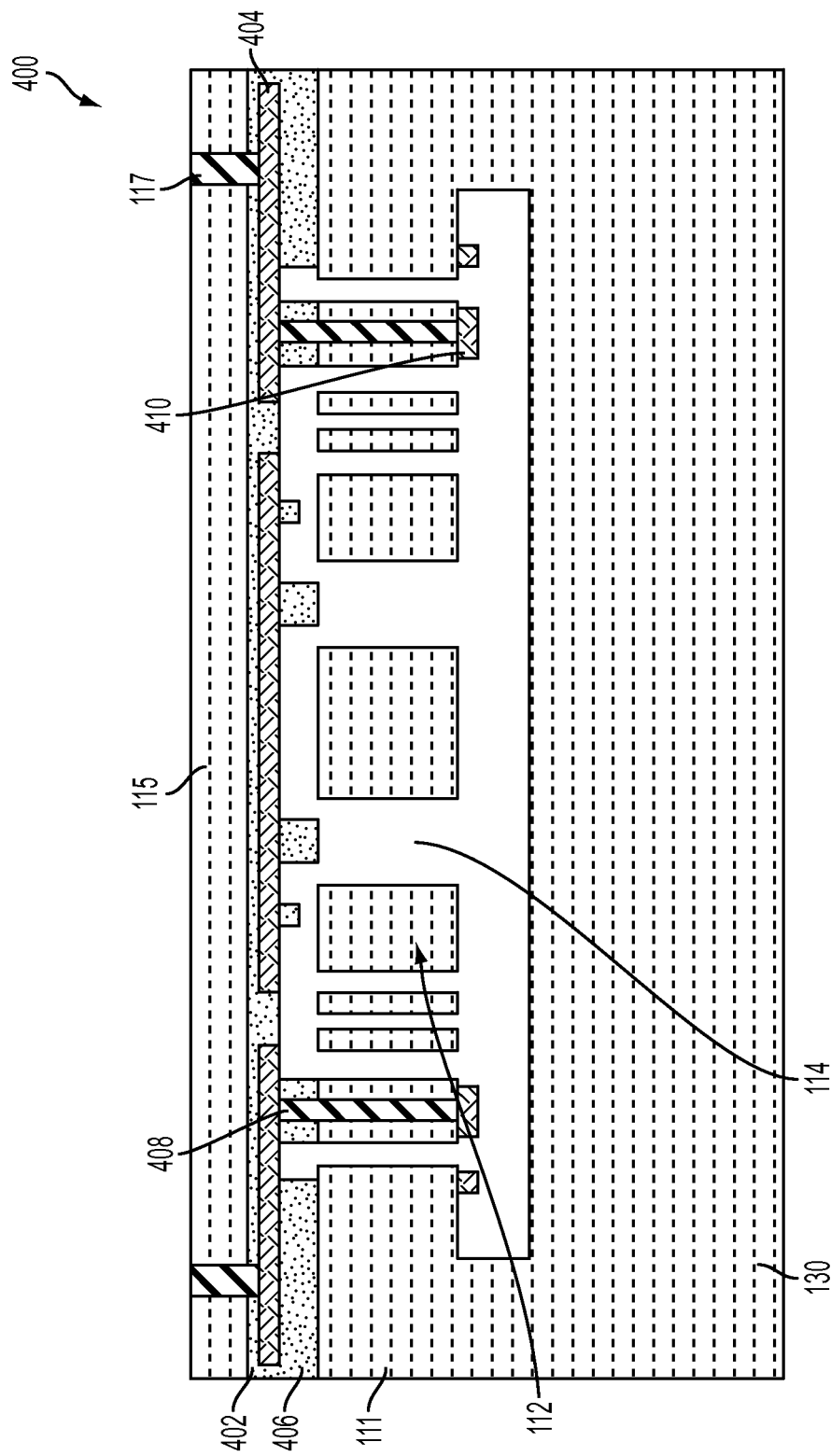

FIG. 4H is cross sectional views of MEMS package 400 during a stage of production in accordance with one or more embodiments. Conductive plug 117 is formed through carrier 115 to electrically connect to first conductive layer 404. Conductive plug 117 extends through carrier 115 and first oxide layer 402 to connect to first conductive layer 404. Conductive plug 117 is formed by making an opening in carrier 115 and first oxide layer 402; and depositing a conductive material in the opening. In some embodiments, the opening is formed by a photolithography/etching process, a laser drilling process, or another suitable material removal process. In some embodiments, the conductive material includes tungsten, copper or another suitable conductive material. In some embodiments the conductive material is formed by PVD, ALD, sputtering or another suitable formation method. In some embodiments, an oxide liner layer is formed between the conductive material and sidewalls of the opening to provide electrical isolation for the conductive material. In some embodiments, the conductive material for conductive plug 117 is a same material as for conductive via 408. In some embodiments, the conductive material for conductive plug 117 is different from the conductive material for conductive via 408.

In some embodiments, forming conductive plug 117 is replaced by forming isolation trenches in carrier 115 to provide electrical connection to bond pad 116 directly through the carrier as in MEMS device 300. In some embodiments, the isolation trenches are formed by making an opening in carrier 115 and forming an insulating material in the openings in carrier 115.

Figure 4I:
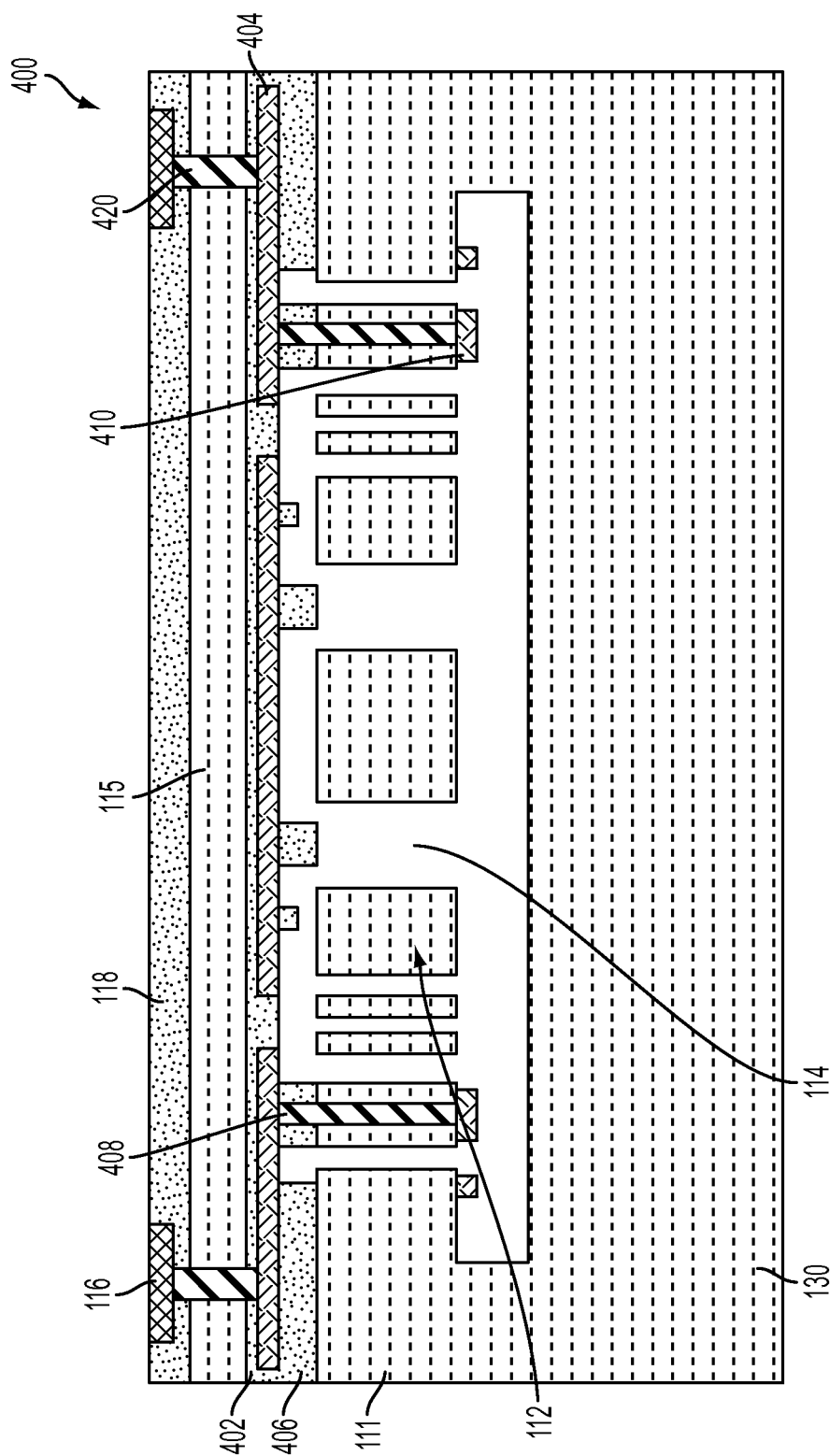

FIG. 4I is cross sectional views of MEMS package 400 during a stage of production in accordance with one or more embodiments. A third oxide layer 118 is formed over carrier 115 on an opposite side from MEMS section 112. In some embodiments, carrier 115 is thinned to expose a portion of conductive plug 117 prior to forming third oxide layer 118. In some embodiments, carrier 115 is thinned using an etching process or another suitable material removal process. Third oxide layer 118 patterned to expose a portion of conductive plug 117. Bond pad 116 is formed to electrically connect to conductive plug 117. In some embodiments, third oxide layer 117 is patterned to form an opening for bond pad 116.

Third oxide layer 118 provides electrical isolation between carrier 115 and interconnect structure 124 bonded during later processing. In some embodiments, third oxide layer 118 includes silicon oxide, or another suitable oxide material. In some embodiments, third oxide layer 118 has a thickness ranging from about 0.5 microns (µm) to about 5 µm. The thickness of third oxide layer 118 is selected based on an amount of isolation desired between carrier 115 and interconnect structure 124. In some embodiments, third oxide layer 118 is formed by PVD, CVD, sputtering or other suitable formation methods. In some embodiments, third oxide layer 118 includes a same material as first oxide layer 402 or second oxide layer 406. In some embodiments, third oxide layer 118 includes a different material from first oxide layer 402 or second oxide layer 406. In some embodiments, a formation process for third oxide layer 118 is a same process as that used to form at least one of first oxide layer 402 or second oxide layer 406. In some embodiments, the formation process for third oxide layer 118 is a different process from that used to form first oxide layer 402 or second oxide layer 406.

Bond pad 116 is formed by making an opening in third oxide layer 118. A conductive material is then deposited over third oxide layer 118. Excess conductive material outside the opening in third oxide layer 118 is removed by a CMP process, a grinding process or another suitable material removal process. In some embodiments, bond pad 116 includes copper, or another suitable conductive material.

Figure 4J:
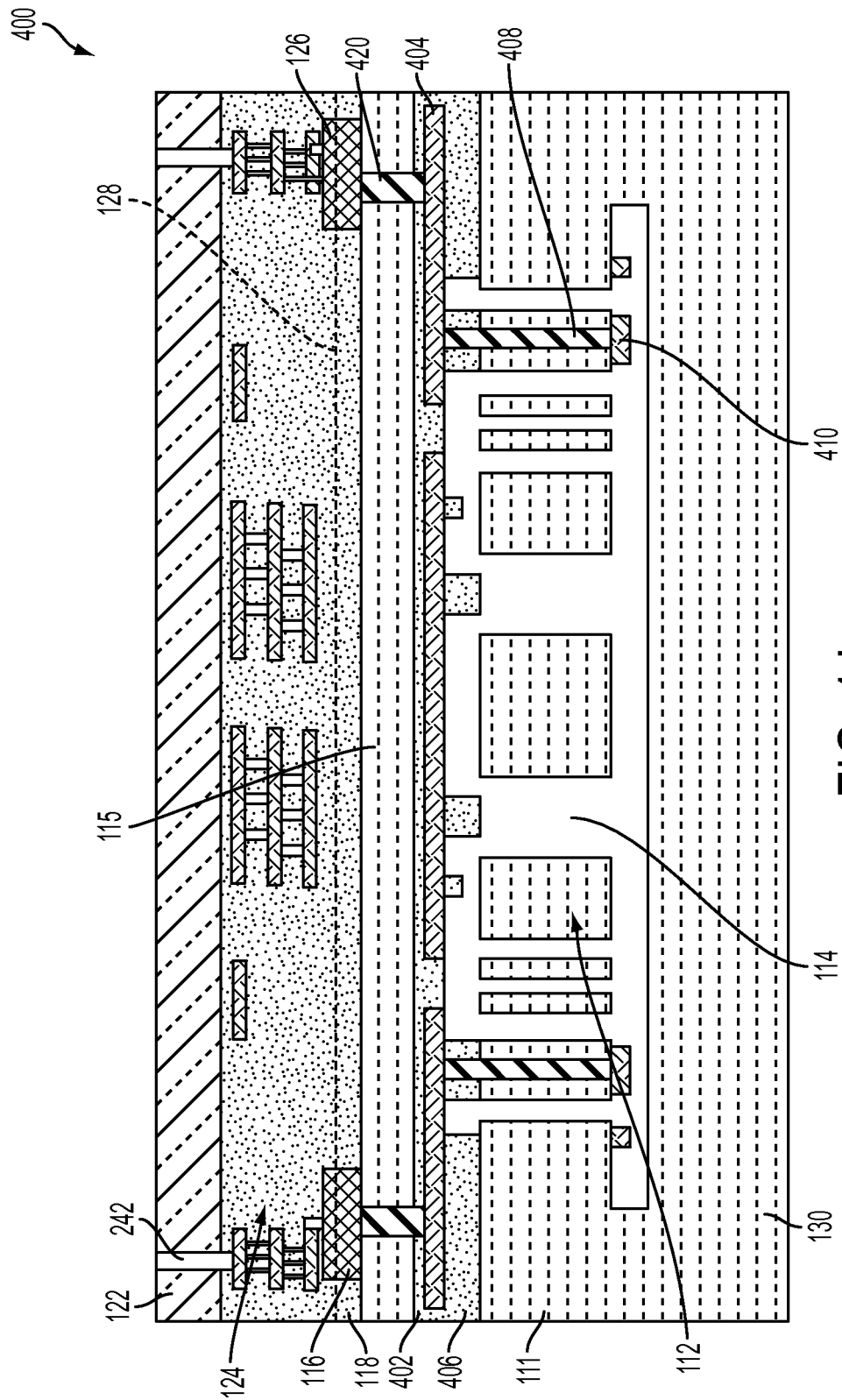

FIG. 4J is cross sectional views of MEMS package 400 during a stage of production in accordance with one or more embodiments. Interconnect structure 124 is bonded to carrier 115. The bonding process causes bond pad 116 and bond pad 126 to undergo a re-graining process. The re-graining process results in grain boundaries which extend across interface 128. The re-grained interface of bond pad 116 and bond pad 126 decreases electrical resistance between the bond pads. In some embodiments, interconnect structure 124 is bonded to carrier 115 using a fusion bonding process. In some embodiments, interconnect structure 124 is fusion bonded to carrier 115 using a same fusion bonding process as that used to bond carrier 115 to substrate 111.

In comparison with approaches that use only eutectic bonding between bond pad 116 and bond pad 126, fusion bonding between oxide layer 118 and interconnect structure 124 reduces cost because the bonding is able to be performed at a lower temperature than eutectic bonding. In some embodiments, which include isolation trench 119, as in MEMS device 300, fusion bonding between carrier 115 and interconnect structure 124 provides similar cost reduction benefits in comparison with approaches that rely on eutectic bonding.

The re-graining of bond pad 116 and bond pad 126 also provides more reliable electrical connection between bond pad 116 and bond pad 126 in comparison with approaches which use eutectic bonding. As a result, MEMS device 100, MEMS package 200, MEMS package 200', MEMS device 300 or MEMS package 400 are able to be produced at lower cost with a higher reliability in comparison with other approaches which have interconnect structure 124 adjacent to vacuum region 114 and eutectic bonding between bond pad 116 and bond pad 126.

Via plug 242 is also formed through active circuit substrate 122. In some embodiments, via plug 242 is formed by making an opening in active circuit substrate 122 and forming a conductive material in the opening. In some embodiments, the opening is formed by a photolithography/etching process, laser drilling or another suitable material removal process. In some embodiments, via plug 242 includes tungsten or another suitable conductive material. In some embodiments, the conductive material is formed by PVD, ALD, plating, sputtering or another suitable formation process.

In some embodiments, a TSV, such as TSV 262 (FIG. 2B), is used instead of conductive plug 242. In some embodiments, the TSV is formed by forming an oxide lining the opening in active circuit substrate 122 and forming a conductive material in the oxide lined opening. In some embodiments, the conductive material of the TSV is formed by PVD, ALD, plating, sputtering or another suitable formation process. In some embodiments, the conductive material includes copper, aluminum or another suitable conductive material.

Figure 4K:
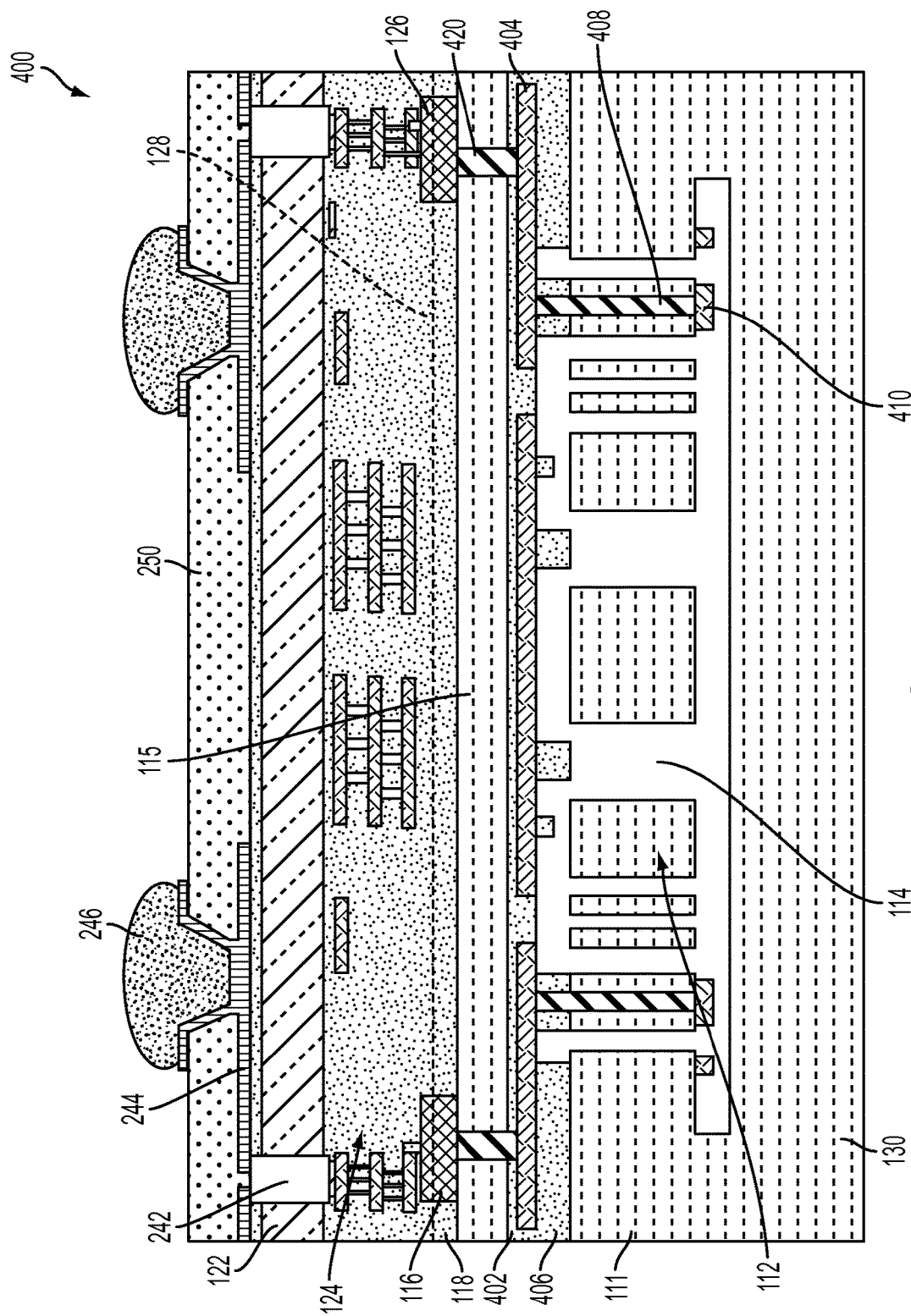

FIG. 4K is cross sectional views of MEMS package 400 during a stage of production in accordance with one or more embodiments. RDL 244, solder bump 246 and polymer layer 250 are formed over active circuit substrate 122. In some embodiments, RDL 244 is formed simultaneously with the TSV or conductive plug 242. In some embodiments, RDL 244 is formed separately from the TSV or conductive plug 242. In some embodiments, RDL 244 is formed by depositing a layer of conductive material and then patterning the conductive material. In some embodiments, the conductive material is deposited by PVD, ALD, plating, sputtering or another suitable deposition process. In some embodiments, the conductive layer is patterned by an etching process, laser drilling or another suitable material removal process.

Polymer layer 250 is formed by depositing a polymer material over RDL 244 and carrier 115. In some embodiments, an oxide layer is formed between polymer layer 250 and carrier 115. In some embodiments, polymer layer 250 is formed by CVD, PVD, or another suitable formation process. In some embodiments, polymer layer 250 includes PBO, polyimide or another suitable polymer.

Solder ball 246 is formed in an opening in polymer layer 250. In some embodiments, the opening in polymer layer 250 is formed by an etching process, laser drilling or another suitable material removal process. In some embodiments, an under bump metallurgy (UBM) layer is formed between polymer layer 250 and solder ball 246. In some embodiments, solder ball 246 is formed in the opening in polymer layer by screening, printing, or another suitable formation process.

One of ordinary skill in the art would recognize that additional steps are added to the process described above with respect to FIGS. 4A-4K, in some embodiments. In addition some steps are able to be replaced or omitted, in some embodiments.

One aspect of this description relates to a micro electromechanical system (MEMS) device. The MEMS device includes a MEMS section attached to a substrate, and a cap bonded to a first surface of the substrate. The MEMS device further includes a carrier bonded to a second surface of the substrate opposite the first surface, wherein the carrier is free of active devices, and the cap and the carrier define a vacuum region surrounding the MEMS section. The MEMS device further includes a bond pad on a surface of the carrier opposite the MEMS section, wherein the bond pad is electrically connected to the MEMS section.

Another aspect of this description relates to a micro electromechanical system (MEMS) package. The MEMS package includes a MEMS section attached to a substrate, and a cap bonded to a first surface of the substrate. The MEMS package further includes a carrier bonded to a second surface of the substrate opposite the first surface, wherein the carrier is free of active devices, and the cap and the carrier define a vacuum region surrounding the MEMS section. The MEMS device further includes a bond pad on a surface of the carrier opposite the MEMS section, wherein the bond pad is electrically connected to the MEMS section. The MEMS package further includes an active circuit wafer, the active circuit wafer comprising an active circuit substrate and an interconnect structure, the interconnect structure bonded to the surface of the carrier opposite the MEMS section at an interface, wherein the carrier is positioned to block outgassing from the interconnect structure from entering the vacuum region. The MEMS package further includes a conductive element through the active circuit substrate, the conductive element configured to transfer a signal to external circuitry.

Still another aspect of this description relates to a method of making a micro electromechanical system (MEMS) package. The method includes patterning a substrate to form a MEMS section, and bonding a cap to a first surface of the substrate. The method further includes bonding a carrier to a second surface of the substrate opposite the first surface, wherein the carrier is free of active devices, and the cap and the carrier define a vacuum region surrounding the MEMS section. The method further includes forming a bond pad on a surface of the carrier opposite the MEMS section, wherein the bond pad is electrically connected to the MEMS section.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A micro electromechanical system (MEMS) device comprising:
    a MEMS section attached to a substrate;
    a cap bonded to a first surface of the substrate;
    a carrier bonded to a second surface of the substrate opposite the first surface, wherein the carrier is free of active devices, and the cap and the carrier define a vacuum region surrounding the MEMS section;
    a bond pad within the carrier and exposed at a surface of the carrier opposite the MEMS section, wherein the bond pad is electrically connected to the MEMS section; and
    an isolation trench extending through the carrier and encircling a periphery of the bond pad in the carrier.

2. The MEMS device of claim 1, wherein the bond pad is configured to receive a signal through a portion of the carrier encircled by the isolation trench.

3. The MEMS device of claim 2, wherein a surface of the bond pad is level with a surface of the carrier.

4. The MEMS device of claim 1, further comprising an active circuit wafer, the active circuit wafer comprising:
    an active circuit substrate comprising active devices; and
    an interconnect structure configured to convey signals to and from the active devices, wherein the interconnect structure is bonded to the surface of the carrier opposite the MEMS section at an interface, and the carrier is positioned to block outgassing from the interconnect structure from entering the vacuum region.

5. The MEMS device of claim 4, wherein the interconnect structure comprises an interconnect bond pad bonded to the bond pad, wherein grain boundaries between the interconnect bond pad and the bond pad extend across the interface.

6. The MEMS device of claim 1, wherein the cap comprises a first metal layer, the substrate comprises a second metal layer, and the first metal layer and the second metal layer are in a eutectic bond.

7. The MEMS device of claim 1, wherein the isolation trench extends through an entirety of the carrier.

8. A micro electromechanical system (MEMS) package comprising:
    a MEMS section attached to a substrate;
    a cap bonded to a first surface of the substrate;
    a carrier bonded to a second surface of the substrate opposite the first surface, wherein the carrier is free of active devices, and the cap and the carrier define a vacuum region surrounding the MEMS section;
    a bond pad on a surface of the carrier opposite the MEMS section, wherein the bond pad is electrically connected to the MEMS section;
    an active circuit wafer, the active circuit wafer comprising an active circuit substrate and an interconnect structure, the interconnect structure bonded to the surface of the carrier opposite the MEMS section at an interface, wherein the carrier is positioned to block outgassing from the interconnect structure from entering the vacuum region, and the interconnect structure comprises an interconnect bond pad bonded to the bond pad, wherein grain boundaries between the interconnect bond pad and the bond pad extend across the interface; and a conductive element through the active circuit substrate, the conductive element configured to transfer a signal to external circuitry.

9. The MEMS package of claim 8, further comprising a conductive plug extending through the carrier, the conductive plug connected to the bond pad, wherein the conductive plug comprises tungsten.

10. The MEMS package of claim 8, further comprising an isolation trench extending through the carrier, the isolation trench surrounding the bond pad, wherein the bond pad is configured to receive a signal through the carrier between the isolation trench.

11. The MEMS package of claim 10, wherein a surface of the bond pad is level with a surface of the carrier.

12. The MEMS package of claim 8, wherein the conductive element comprises a tungsten plug.

13. The MEMS package of claim 8, wherein the conductive element comprises a through substrate via (TSV).

14. The MEMS package of claim 8, further comprising:
a re-distribution layer (RDL) electrically connected to the conductive element;
a polymer layer over the RDL; and
a solder ball in the polymer layer, the solder ball electrically connected to the RDL.

15. The MEMS package of claim 8, wherein the cap comprises a first metal layer, the substrate comprises a second metal layer, and the first metal layer and the second metal layer are in a eutectic bond.

16. A micro electromechanical system (MEMS) device comprising:
a MEMS section attached to a substrate;
a cap bonded to a first surface of the substrate;
a carrier bonded to a second surface of the substrate opposite the first surface, wherein the carrier is free of active devices, and the cap and the carrier define a vacuum region surrounding the MEMS section;
an interconnect structure electrically connected to the MEMS section, wherein the carrier is bonded to the interconnect structure by a semiconductor-oxide bond;
a first bond pad in the carrier; and
a second bond pad in the interconnect structure, wherein grain boundaries of the first bond pad extend across an interface of the first bond pad and the second bond pad.

17. The MEMS device of claim 16, further comprising a conductive layer between the MEMS section and the carrier, wherein the conductive layer is electrically isolated from the MEMS section.

18. The MEMS device of claim 16, further comprising an isolation trench in the carrier, wherein a portion of the carrier is between the isolation trench and the first bond pad.

19. The MEMS device of claim 16, wherein sidewalls of the first bond pad are aligned with sidewalls of the second bond pad.

20. The MEMS device of claim 16, wherein at least one sidewall of the first bond pad is offset from sidewalls of the second bond pad.

* * * * *